US012674361B2

(12) United States Patent
Zhu et al.

(10) Patent No.: US 12,674,361 B2
(45) Date of Patent: Jul. 7, 2026

(54) POLYCRYSTALLINE DIAMOND COMPACT BIT WITH LARGE-SIZED CUTTERS

(71) Applicant: Southwest Petroleum University, Chengdu (CN)

(72) Inventors: Xiaohua Zhu, Chengdu (CN); Weiji Liu, Chengdu (CN); Zhihang Liu, Chengdu (CN)

(73) Assignee: Southwest Petroleum University, Chengdu (CN)

( * ) Notice: Subject to any disclaimer, the term of this patent is extended or adjusted under 35 U.S.C. 154(b) by 0 days.

(21) Appl. No.: 19/274,556

(22) Filed: Jul. 19, 2025

(65) Prior Publication Data

US 2026/0028883 A1    Jan. 29, 2026

(30) Foreign Application Priority Data

Jul. 26, 2024    (CN) .......................... 202411010394.9

(51) Int. Cl.
E21B 10/55        (2006.01)
C30B 29/04        (2006.01)
E21B 10/43        (2006.01)

(52) U.S. Cl.
CPC .............. E21B 10/55 (2013.01); C30B 29/04 (2013.01); E21B 10/43 (2013.01)

(58) Field of Classification Search
CPC .................................. E21B 10/42; E21B 10/43
See application file for complete search history.

(56) References Cited

U.S. PATENT DOCUMENTS

| | | | | |
|---|---|---|---|---|
| 4,838,366 A * | 6/1989 | Jones | ...................... | E21B 10/42 |
| | | | | 175/413 |
| 4,913,247 A * | 4/1990 | Jones | ...................... | E21B 10/54 |
| | | | | 51/307 |
| 5,147,001 A * | 9/1992 | Chow | ...................... | E21B 10/54 |
| | | | | 175/428 |
| 8,281,882 B2 * | 10/2012 | Hall | ........................ | E21B 10/62 |
| | | | | 175/426 |
| 9,347,276 B2 * | 5/2016 | Paros | ...................... | E21B 10/42 |
| 10,385,620 B2 * | 8/2019 | Jones | ...................... | E21B 10/42 |
| 2013/0262048 A1 * | 10/2013 | Tang | ........................ | E21B 10/54 |
| | | | | 703/1 |
| 2025/0018470 A1 * | 1/2025 | Bradford, III | ........... | B22F 7/06 |

* cited by examiner

*Primary Examiner* — Yanick A Akaragwe
(74) *Attorney, Agent, or Firm* — Hemisphere Law, PLLC

(57)    ABSTRACT

A polycrystalline diamond compact (PDC) bit with large-sized cutters includes: a bit body and a bit connecting component. The bit body is provided with blades, each of the blades has a gauge surface, and nozzles are defined on the bit body and are disposed between the blades; and the blades are provided with integral cutters respectively, each of the integral cutters covers a working surface of a corresponding one of the blades, a shape of each of the integral cutters matches with a crown shape of the corresponding one of the blades, and each of the integral cutters is installed on and fitted along the crown of the corresponding one of the blades. The bit achieves full coverage of the blades with cutters, which results in a lower cutter density under the same weight on bit.

12 Claims, 6 Drawing Sheets

POLYCRYSTALLINE DIAMOND COMPACT BIT WITH LARGE-SIZED CUTTERS

CROSS-REFERENCE TO RELATED APPLICATION

This application claims priority to Chinese Patent Application No. 202411010394.9, filed on Jul. 26, 2024, which is herein incorporated by reference in its entirety.

TECHNICAL FIELD

The disclosure relates to the technical field of drilling tools, and more particularly to a polycrystalline diamond compact (PDC) bit with large-sized cutters.

BACKGROUND

Currently, PDC bits have gained widespread application in oil and gas drilling engineering, capturing over 80% of the market share and more than 90% of the footage drilled, thus dominating the global bit market. The PDC bit consists of two main components including: a bit body and cutters, and the PDC cutters are an essential material for rock breaking in drilling engineering and are the core component of the PDC bit. The performance of the cutter largely determines the footage drilled and the rate of penetration (ROP) of the bit.

PDC is manufactured by pressing two layers of material (the polycrystalline diamond layer and the cemented carbide layer) under high-temperature and high-pressure conditions (1300-1500° C. and approximately 6 GPa). After processing, the cutters are welded to the bit body, with each cutter being individually inserted into its corresponding hole, and this process is quite complicated. As oil and gas exploration in China accelerates into deeper strata and unconventional resources, the increasing complexity of rock formations encountered by the bit leads to low rock-breaking efficiency, slow ROP, and short footage, which necessitates frequent bit replacement. Sometimes, to save costs, the bit is reused, which requires replacing damaged cutters. This process is also time-consuming and labor-intensive.

On the other hand, the cutter layout density affects the ROP and wear resistance of the bit. Under the same weight on bit (WOB), the higher the cutter layout density, the smaller the WOB each cutter has to bear, resulting in shallower penetration into the formation and reduced rock-breaking efficiency. An increase in cutters leads to a decrease in drilling rate. This is because the reduced pressure on each cutter decreases its penetration depth into the formation, which also negatively impacts the cleaning and cooling of the bit.

Nowadays, diamonds are divided into synthetic diamonds and natural diamonds. Large-sized natural diamonds are extremely expensive, and thus are relatively rarely used. Currently, the main methods for synthesizing synthetic diamonds include the high-temperature high-pressure (HTHP) method and the chemical vapor deposition (CVD) method. Both methods have relatively stringent production conditions. For the HTHP method, it takes about two weeks to grow a rough diamond of over 10 carats using the HTHP method, and the cost is relatively high. This is also one of the reasons why large-sized cutters are less commonly used.

Additionally, in hard formations or formations with interbedded hard layers, the large-sized cutters are prone to detachment of the polycrystalline diamond layer or cutter chipping, and in severe cases, the cutters may even fall off.

Therefore, by optimizing the structure of the large-sized cutters and integrating the cutters on each blade into one unit, a large cutter can better withstand impact forces compared to smaller cutters. Moreover, when a cutter is damaged, the remaining shape still retains self-sharpening properties, which helps maintain good cutting efficiency. For soft and medium-soft formations, large-sized cutters, with their excellent aggressiveness, can significantly improve rock-breaking efficiency and reduce usage costs. With the progress of science and technology, breakthroughs have been achieved in high-temperature high-pressure synthesis technology and drilling equipment. The technical barriers that previously limited the application of super-large cutters have gradually been removed, revitalizing the technology of super-large cutters for rock breaking. As production technology advances and application fields continue to expand, the demand for larger-sized polycrystalline diamond and diamond compact tools or cutters is likely to increase. Currently, some foreign companies are capable of massproducing products with diameters ranging from 50.8 to 80.0 millimeters (mm).

SUMMARY

Based on the above engineering background, in response to the shortcomings of the related art, the disclosure provides a PDC bit with large-sized cutters.

The PDC bit with the large-sized cutters includes a bit body and a bit connecting component. The bit body is provided with blades, each of the blades has a gauge surface, and nozzles are defined on the bit body and are disposed between the blades; and the blades are provided with integral cutters respectively, each of the integral cutters covers a cutter installation working surface of a corresponding one of the blades, a shape of each of the integral cutters matches with a shape of a crown of the corresponding one of the blades, and each of the integral cutters is installed on and fitted along the crown of the corresponding one of the blades.

In an embodiment, a back rake angle of each of the integral cutters is in a range of 5-30°, the back rake angle of each of the integral cutters is adjusted according to an actual situation, and back rake angles of the integral cutters on the blades are same or different to meet requirements for force balance. The back rake angle is an angle between a working surface of the integral cutters and an outer normal line of the bit surface passing through a cutter positioning point.

In an embodiment, a gauge cutter is disposed on the gauge surface; and the gauge cutter consists of multiple conventional gauge cutters, or the gauge cutter is a strip-shaped gauge cutter.

In an embodiment, when the gauge cutter consists of the conventional gauge cutters, a diameter of each of the conventional gauge cutters is 13 millimeters (mm), a number of the conventional gauge cutters is in a range of 3-6, and a back rake angle of each of the conventional gauge cutters is in a range of 15-20°;

when the gauge cutter is the strip-shaped gauge cutter, the strip-shaped gauge cutter is a single continuous strip-shaped gauge cutter, and a back rake angle of the strip-shaped gauge cutter is in a range of 15-20°. The back rake angle is an angle between a working surface of the gauge cutter and an outer normal line of the bit surface passing through a cutter positioning point.

In an embodiment, an exposed height of each of the integral cutters is adjustable and set according to a required exposed height. The exposed height is a height of a part of each integral cutter protruding from the corresponding blade.

In an embodiment, the integral cutters have multiple types, different types of the integral cutters have different dimensions and/or different working surface shapes, the dimensions include: a length, a width, a thickness, and a size of chamfers on adjacent surfaces, and structures of the working surface shapes at least include: a planar surface structure, a wavy surface structure, and a serrated surface structure.

In an embodiment, working heights of the integral cutters on the blades are changed by selecting different initial heights of the integral cutters; or the working heights of the integral cutters on the blades are changed by selecting same initial heights of the integral cutters and adjusting installation angles of the integral cutters on the blades; or the working heights of the integral cutters on the blades are changed by disposing shims on installation parts of the integral cutters respectively.

In an embodiment, types of the integral cutters on the blades are different, and lengths of the integral cutters on the blades are different to make working surfaces of the integral cutters fully cover a wellbore bottom to thereby achieve cutting to the wellbore bottom, and to make at least one of the blades fully cover the wellbore bottom.

In an embodiment, a number of the blades on the bit body is five, a number of main blades (also referred to as long blades) of the blades is at least two, each of the main blades of the blades is mounted with a corresponding one of the integral cutters, and cutting surfaces of the main blades of the blades together are configured to fully cover the wellbore bottom. A long blade refers to a blade that extends from a center of the bit to an outer edge of the bit, covering the entire bit. The length of the long blade is mainly related to the size of the bit. For example, for a 215.9 mm bit, the length of the long blade is around 107.95 mm, and the height of the blade is generally between 20 mm and 35 mm.

The disclosure has the following advantages.

1. By using a single large-sized cutter, the number of installations and removals of the cutters during bit manufacturing can be significantly reduced, while the convenience of single-time installation is enhanced. For scenarios requiring frequent bit replacement, this substantially saves time and economic costs.

2. When subjected to impact forces, the large-sized integral cutters are better able to withstand and resist the impact forces compared to smaller cutters, greatly extending the service life of the bit. The large-sized cutters can distribute more pressure, which significantly enhances the ability to penetrate the formation, and have greater aggressiveness and improved rock-breaking efficiency. Moreover, the integral cutters increase the volume of the polycrystalline diamond layer, which improves the wear resistance and overall heat dissipation of the PDC cutters.

3. The disclosure provides a variety of integral cutter structures. According to the formation conditions, an appropriate type can be selected for targeted formation treatment when needed, thereby improving drilling efficiency. In some cases, the blades of the bit can be equipped with cutters of different dimensions to meet the demands of different formations.

4. When using the integral cutters, if one of the integral cutters becomes damaged during the cutting process, the remaining cutters can still continue to cut. This increases the service life of the bit. Additionally, when the working surface has a curved shape, even after the cutter wear, the remaining shape still retains self-sharpening properties, which helps maintain good cutting efficiency.

5. In hard formations or formations with interbedded hard layers, conventional cutters are prone to detachment of the polycrystalline diamond layer or chipping. In severe cases, the cutters may even fall off. Therefore, by redesigning the cutter structure and integrating the cutters on each blade into one unit, and designing a structure suitable for formation cutting, a single cutter can better withstand impact forces compared to conventional cutters. For soft and medium-soft formations, the large-sized cutter, with the excellent aggressiveness, can significantly improve rock-breaking efficiency and reduce usage costs.

DESCRIPTION OF REFERENCE SIGNS

1: integral cutter; 2: nozzle; 3: bit body; 4: bit connecting component; 5: conventional gauge cutter; 6: strip-shaped gauge cutter; 7: irregularly-shaped integral cutter; 8: blade; 81: main blade; 9: gauge surface; 10: cutter installation working surface; 11: working surface of integral cutter; 12: shim; 71: working surface of irregularly-shaped integral cutter; 101: exposed height; 102: installation part.

DETAILED DESCRIPTION OF EMBODIMENTS

The disclosure is further described below in connection with embodiments, and it should be noted that in this specification, terms such as "upper" and "lower" are used only for convenience in descriptions of accompanying drawings, are not intended to limit orientation in actual use, and do not necessarily require or imply any such actual relationship or order between these entities or operations. And terms such as "include" "have" or any other variations thereof are intended to cover non-exclusive inclusion, thereby a process, a method, an article, or an equipment including a set of elements includes not only the elements but also other elements not expressly listed, or inherent elements to the process, the method, the article or the equipment.

Specific embodiments of the disclosure will be described below in conjunction with accompanied drawings.

Embodiment 1

Figure 1:
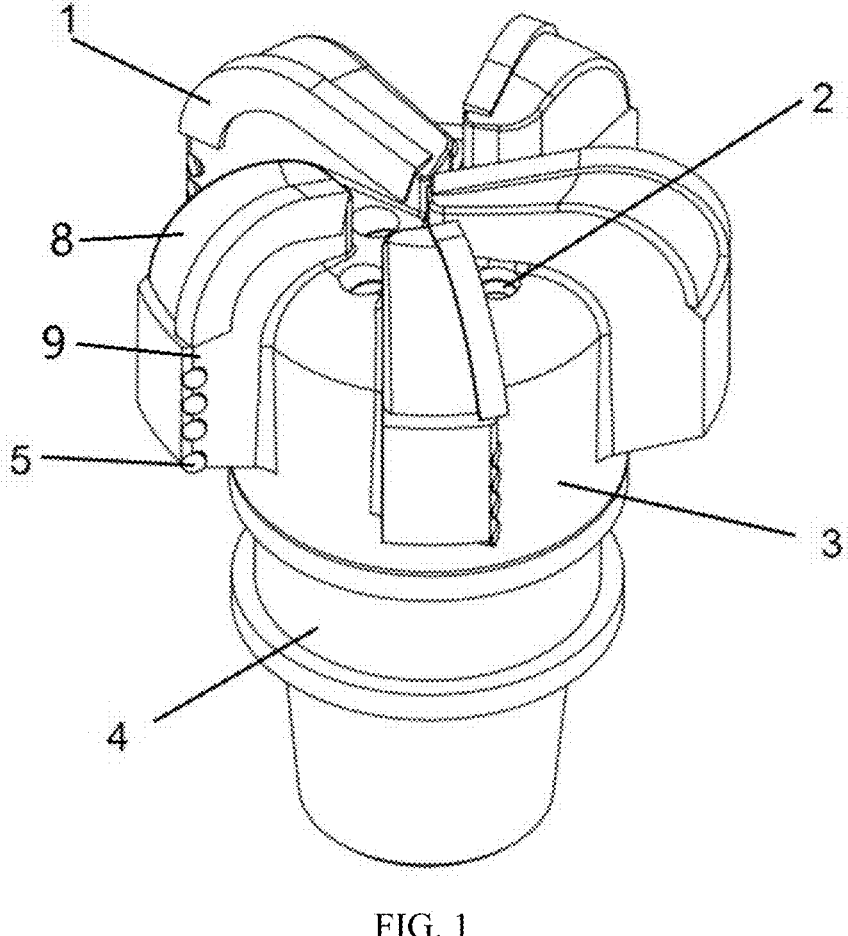
FIG. 1 illustrates a schematic three-dimensional structural diagram of a PDC bit of the disclosure.
Figure 2:
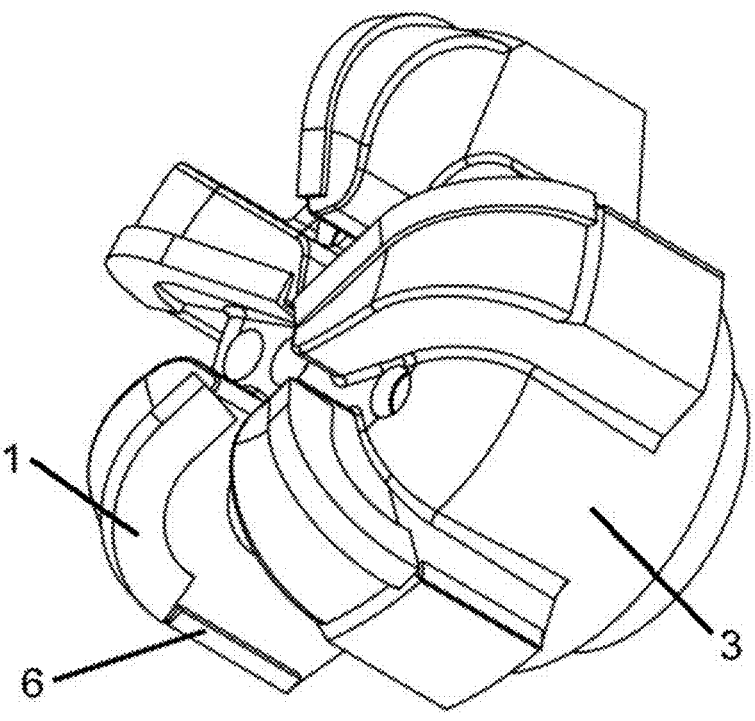
FIG. 2 illustrates a schematic structural diagram of blades and a bit body according to an embodiment of the disclosure.

As shown in FIGS. 1-2, a PDC bit with large-sized cutters includes a bit body 3, and a bit connecting component 4 (also referred to as bit adapter). The bit body 3 is provided with multiple blades 8, each blade 8 has a gauge surface 9, and nozzles 2 are defined on the bit body 3 and are disposed between the blades 8. A number of the nozzles 2 between each group of the blades 8 can be same or different. The blades 8 are provided with integral cutters 1 respectively, each integral cutter 1 covers a cutter installation working surface 10 of a corresponding one of the blades 8, a shape of each integral cutter 1 matches with a shape of a crown of the corresponding blade 8, and each integral cutter 1 is installed on and fitted along the crown of the corresponding blade 8.

Figure 6:
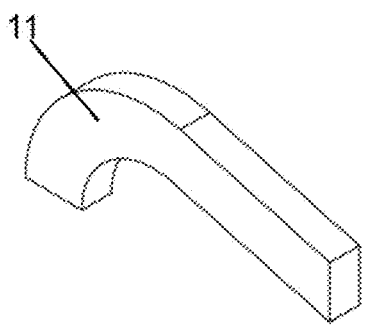
FIG. 6 illustrates a schematic three-dimensional structural diagram of an integral cutter illustrated in FIG. 1.
Figure 7:
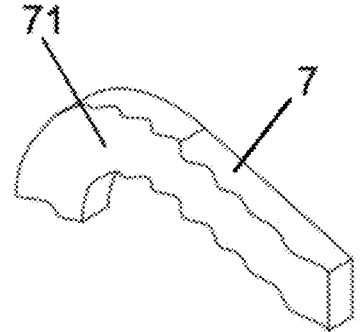
FIG. 7 illustrates a schematic three-dimensional structural diagram of an irregularly-shaped integral cutter illustrated in FIG. 5.

As shown in FIGS. 6-7, the upper curved part, i.e., the crown part, serves as a working surface 11/71 in contact with the wellbore bottom. In this embodiment, the side thickness of each integral cutter 1 can be selected as 10 mm, and the length of each integral cutter 1 is much greater than that of a conventional PDC cutter. Therefore, the structure of a large-sized cutter can be formed. The installation method is to braze each integral cutter 1 along the crown shape of the corresponding blade 8.

Figure 3:
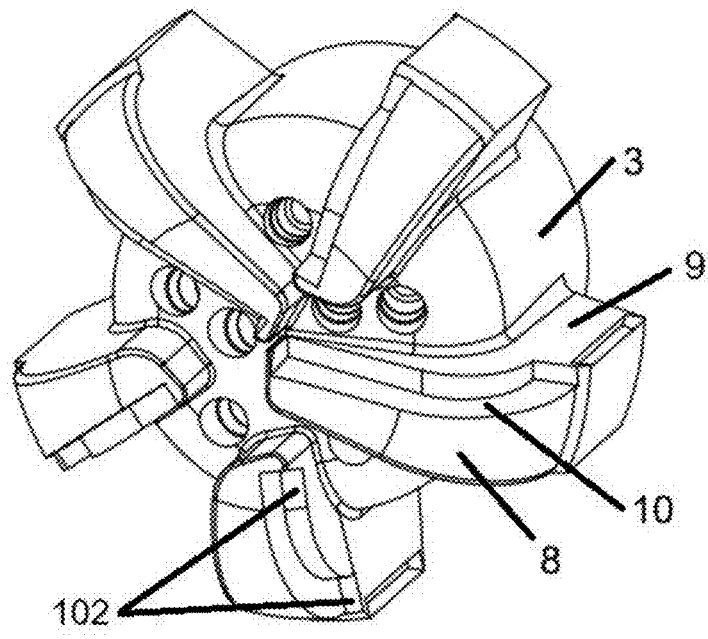
FIG. 3 illustrates a schematic structural diagram of the blades illustrated in FIG. 2 without integral cutters and strip-shaped gauge cutters mounted.

A back rake angle of each integral cutter 1 is in a range of 5-30°, the back rake angle of each integral cutter 1 is adjusted according to an actual situation. When drilling in softer formations, a smaller back rake angle can maximize the ROP. Increasing the back rake angle reduces the ROP but enhances cutter life. When encountering harder formations, the increase in the back rake angle also reduces the likelihood of cutter breakage under impact loads. Meanwhile, back rake angles of the integral cutters 1 on the blades are same or different to meet requirements for force balance. In the embodiment, each integral cutter 1 is installed in a mounting slot by brazing, and the structure of the mounting slot is as shown in FIG. 3. The size of each integral cutter 1 is slightly higher than the corresponding blade 8 by 2 to 3 mm, the structure after installation is shown in FIG. 2, ensuring sufficient cutting volume. During the cutting process, if a single integral cutter 1 encounters a problem, the remaining integral cutters 1 can still continue cutting. Additionally, when subjected to impact forces, a single integral cutter 1 can better withstand the impact forces compared to commonly used small PDC cutter in the related art. This increases the service life of the bit. After the integral cutter 1 is damaged, a new integral cutter 1 can be directly replaced, which greatly saves on time and economic costs.

Embodiment 2

On a basis of the embodiment 1, the gauge surface 9 is provided with a gauge cutter. The gauge cutter consists of multiple conventional gauge cutters 5, or the gauge cutter is a strip-shaped gauge cutter 6.

When the gauge cutter consists of the multiple conventional gauge cutters 5, a diameter of each of the conventional gauge cutters 5 is 13 mm, and a number of the conventional gauge cutters 5 is in a range of 3-6.

Figure 8:
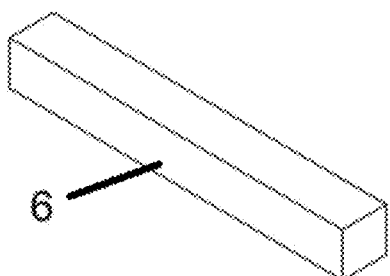
FIG. 8 illustrates a schematic structural diagram of a strip-shaped gauge cutter of the disclosure.
Figure 9:
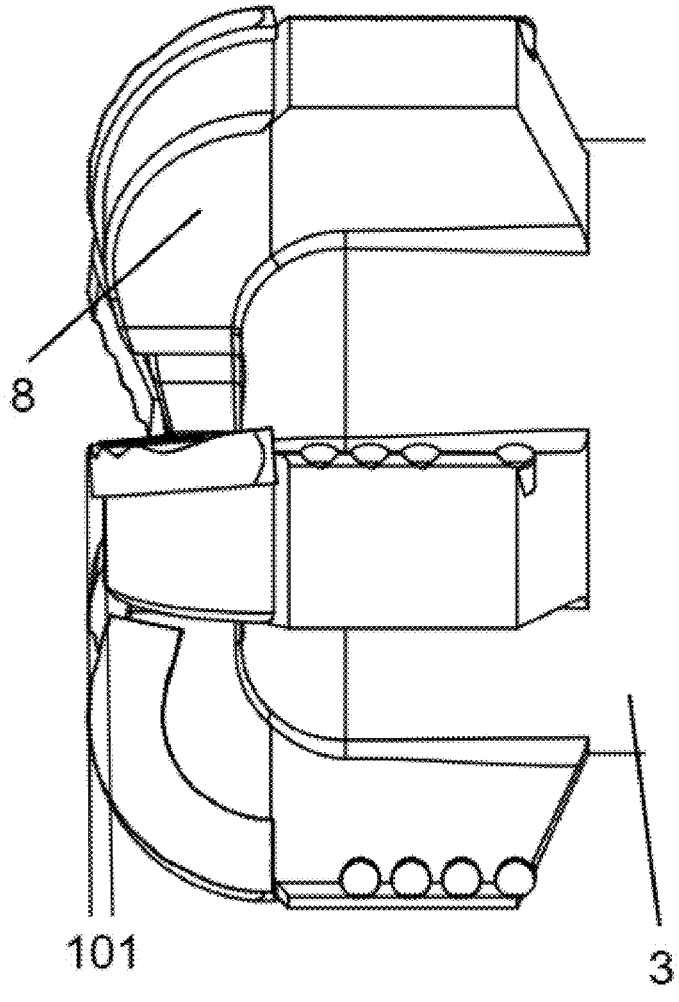
FIG. 9 illustrates a schematic diagram of an exposed height of the integral cutter of the disclosure.
Figure 10:
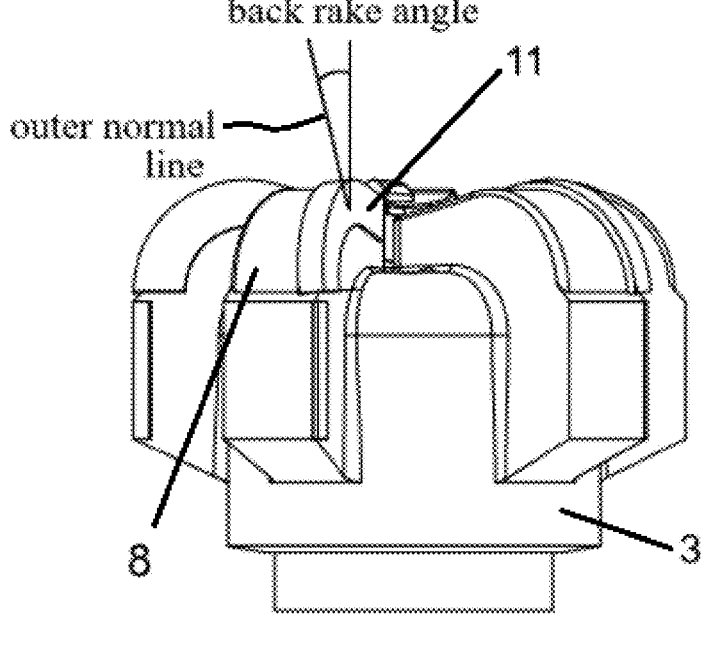
FIG. 10 illustrates a schematic diagram of a back rake angle of the integral cutter of the disclosure.
Figure 11:
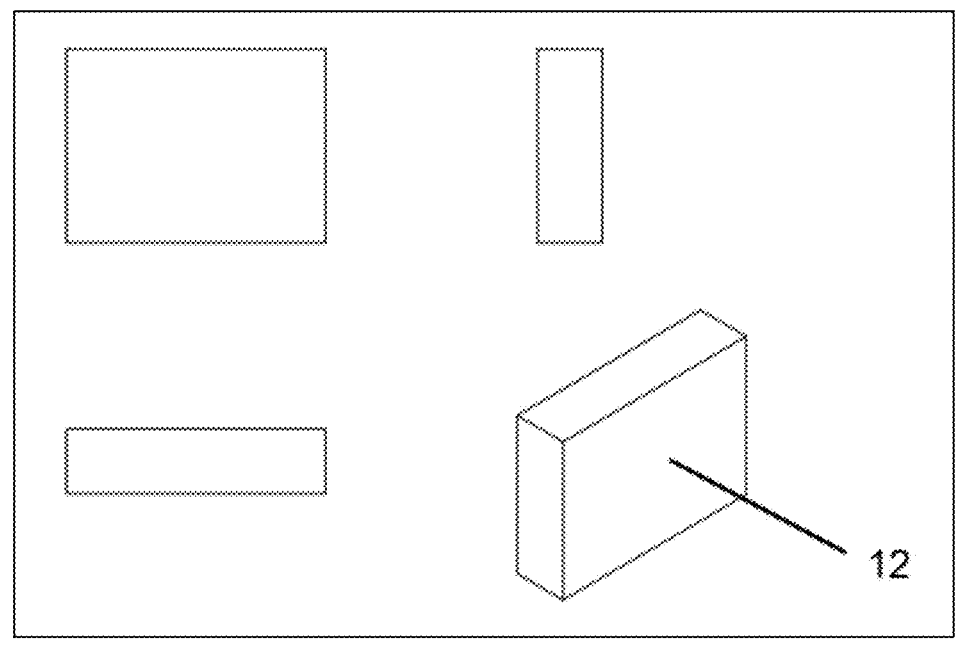
FIG. 11 illustrates a schematic diagram of a shim of the disclosure.

Under normal circumstances, the gauge cutters do not participate in cutting but mainly serve to prevent the wellbore from shrinking in diameter. The more gauge cutters there are, the more assured the cutting diameter of the PDC bit is. However, as the number of the gauge cutters increases, the lateral friction area also becomes larger, and the lateral cutting ability becomes weaker. Therefore, in terms of enhancing the steering capability of the PDC bit, the fewer the gauge cutters, the better. However, if the number of gauge cutter is too small, the bit will lose its gauge protecting ability, resulting in a reduction in the wellbore diameter. Thus, different gauge cutters have their own advantages. In some embodiments, a strip-shaped gauge cutter 6 is used instead. The strip-shaped gauge cutter 6 after installation is shown in FIG. 2, and the structure of its installation position is shown in FIG. 3. The installation method of the strip-shaped gauge cutter 6 is similar to that of the conventional small cutter 5, which includes opening a strip-shaped hole at the edge of the gauge surface 9, with an inclination angle of the strip-shaped hole being 15-20°, thereby making a back rake angle of the gauge cutter in a range of 15-20° as well. Optionally, the thickness of the strip-shaped gauge cutter 6 is 6 mm. The structure of the strip-shaped gauge cutter 6 is shown in FIG. 8, and the strip-shaped gauge cutter 6 is fixed in the strip-shaped hole by brazing.

Embodiment 3

On a basis of the embodiment 1 or the embodiment 2, an exposed height 101 of each integral cutter 1 is adjustable and set according to a required exposed height. Specifically, the integral cutters 1 can have various models or types, different types of the large-sized cutter 1 have different dimensions and/or different working surface shapes. The dimensions include a length, a width, a thickness, and a size of chamfers on adjacent surfaces. The structures of the working surface shapes at least include: a planar surface structure, a wavy surface structure, and a serrated surface structure, and the surface can also feature additional structures such as cones or inlays.

Specific implementation methods are as follows. When the shape of the crown of the blade 8 is determined, the shape of the blade 8 is thereby determined. Therefore, the exposed heights 101 can be adjusted during the design phase by regulating the cutter height. Initial setting heights may be adjusted by selecting different heights of the integral cutters 1. In a second method, the exposed heights 101 are adjusted by regulating the back rake angle of each integral cutter 1 during installation. In addition, a third method is to use matching shims 12 or other means followed by brazing installation, allowing a single height to be adjusted to different heights to accommodate the required formation conditions. When using the shims 12, due to factors such as formation environment, hard alloy shims 12 can be selected and used with pressing and welding to prevent loosening after installation. The dimensions of the shims 12 can have multiple types and the shims 12 can be used in combination with multiple layers or pieces. Each shim 12 is installed on the back side of the corresponding integral cutter 1 (i.e., an installation part 102 of the corresponding integral cutter 1) and placed in the corresponding mounting slot as shown in FIG. 3.

In an embodiment, the shim 12 can also be designed with a planar structure of equal height or a planar structure with an inclined surface. With this design, when using the shim 12 with an inclined surface, the installation angle of the corresponding integral cutter 1 can be directly adjusted using the shim 12.

For hard formations or formations with interbedded hard layers, large-sized cutters are prone to detachment of the polycrystalline diamond layer or chipping. At the same time, in order to improve rock-breaking efficiency, in some embodiments, the integral cutter 1 can be replaced with an irregularly-shaped integral cutter 7. In an embodiment, the planar working surface 11 (i.e., a working surface of the integral cutter) on the side is changed to a wavy working surface 71 (i.e., a working surface of the irregularly-shaped integral cutter). With this structure, rock can be broken more effectively. The curved working surface 71 can better penetrate the formation. Compared with conventional large-sized cutters, it has better impact resistance and wear resistance. In particular, with the wavy surface structure, even if the working surface 71 on the side is damaged, the remaining shape still retains self-sharpening properties, which can maintain good cutting efficiency. Similarly, in another embodiment, the working surface 71 on the side is changed to a serrated surface, which has a similar effect to the wavy surface and better rock-breaking performance, but with a slightly higher wear rate. Therefore, the working surface on the side needs to be selected according to formation and construction period information.

Embodiment 4

On a basis of the embodiment 3, types of the integral cutters 1 mounted on the blades 8 may be same or different, lengths of the integral cutters 1 may be same or different to make working surfaces 11 of the integral cutters 1 fully cover a wellbore bottom to thereby achieve cutting to the wellbore bottom, and to make at least one of the blades 8 provided with the corresponding integral cutter 1 fully cover the wellbore bottom.

Figure 4:
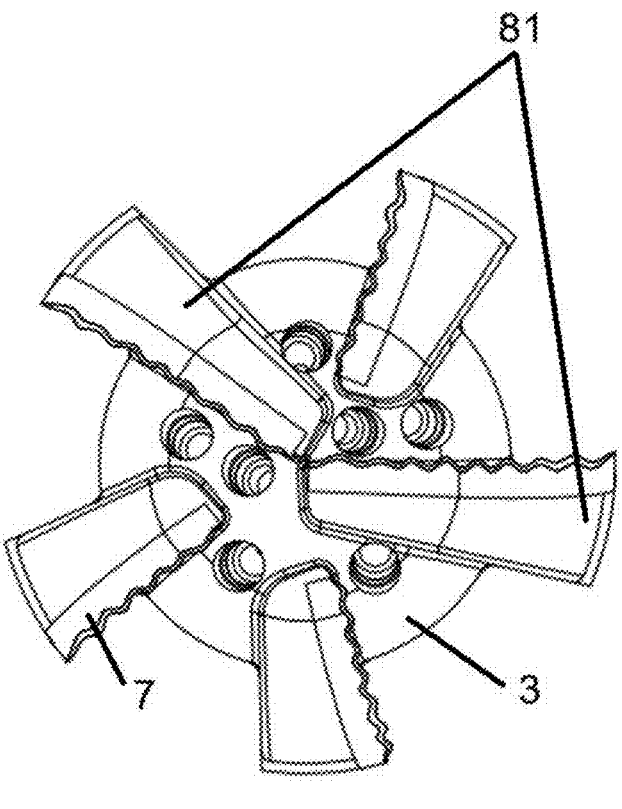
FIG. 4 illustrates a top view of FIG. 1.
Figure 5:
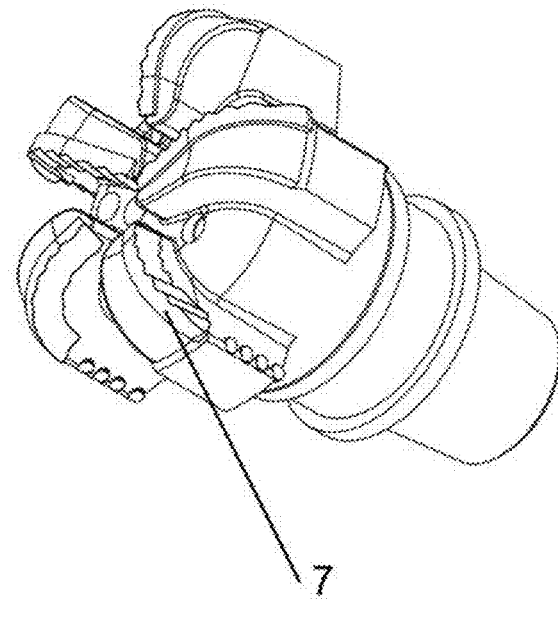
FIG. 5 illustrates a schematic structural diagram of a PDC bit according to another embodiment of the disclosure.

As shown in FIGS. 1, 2 and 4, some of the blades 8 have different dimensions from the others, and the dimensions and positions of the integral cutters 1 installed thereon are also different, allowing all the integral cutters 1 to fully cover the entire wellbore bottom. Compared with using this structure for all blades 8, a better balance can be achieved in terms of cost and effectiveness, thereby improving the overall efficiency of drilling operations.

Specifically, the lengths of the blades in a conventional bit are determined based on the length of each blade during cutter layout. However, in the disclosure, the use of integral cutters 1 allows the lengths of the blades 8 to be considered based on formation conditions, rock-breaking efficiency, service life, and other factors. Long blades (i.e., main blades) 81 of the blades 8 serve as the main cutting blades. The more the number of the long blades 81, the lower the rotational speed will be, but the longer the service life of the bit will be. Conversely, the fewer the number of the long blades 81, the higher the drilling rate will be, but the shorter the service life of the bit will be. Ultimately, as the number of the long blades 81 increases, the cleaning efficiency of the bit may decrease. As the number of the long blades 81 decreases, more downward the WOB is allocated to the remaining long blades 81. Therefore, under the same WOB, the unit load on the integral cutter 1 of the long blade 81 increases, resulting in a greater cutting depth of the cutter, increased the RPO, and higher torque. Thus, when considering the length of the integral cutter 1 on each long blade 81, it is necessary to pursue drilling rate and efficiency while also taking into account the stability, safety, and cleaning efficiency of the bit. To balance the lateral forces generated by the rotational movement of the bit during drilling, at least two long blades 81 are needed at the center of the bit.

The lengths of the integral cutters 1 on the blades 8 can be adapted to different formations. For hard formations, more long blades 81 (i.e., a greater number of long integral cutters 1) can make the bit wear more evenly, prolong its service life, and also provide a stronger ability to drill through hard interlayers. For soft formations, some of the blades 8 can have shorter integral cutters 1, resulting in higher rock-breaking efficiency and faster drilling rate, thus achieving the goal of faster drilling. While meeting the requirements of formation lithology, the number of the long blades 81 should be minimized to economically drill through the formation, while also taking into account the ROP and bit life. As the formation properties range from soft to hard, the lengths of the integral cutters 1 correspondingly range from short to long.

Embodiment 5

Simulation experiments are conducted using the bit of the embodiment 4 and the bit of the embodiment 4 is compared with a conventional cutter bit. Under the same WOB and drilling rate, the WOB is set to 50,000 N, the drilling rate is 9.41 radians per seconds (rad/s), the drilled rock is granite, the experimental time is 8 seconds, and all other experimental conditions are the same. After the experiment, the data is organized and it is found that the bit with the large-sized cutters using the integral cutters 1 of the disclosure achieves a drilling displacement of 59.55 mm within 8 seconds, while the bit with conventional cutter achieves a drilling displacement of 50.66 mm. The comparison shows that the bit with the large-sized cutters of the disclosure has a greater drilling displacement and higher drilling efficiency. The comparison of the slopes also reveals that the integral cutters 1 can more quickly "penetrate" the rock, whereas the conventional-sized cutters have a slower "penetration" process. Throughout the cutting process, the speed of the bit with the large-sized cutters is relatively uniform, while the speed fluctuation of the conventional-sized bit is more noticeable.

Since the rock chosen for this experiment is the hard granite, the bit with the large-sized cutters still has its advantages. Therefore, in medium-soft formations, especially in soft formations, the large-sized bit can achieve excellent drilling rate and efficiency.

The above mentioned is only exemplary embodiments of the disclosure, and is not a limitation of the disclosure. Although the disclosure is described by the illustrated embodiments, it is not intended to limit the disclosure, and those skilled in the art may make some changes or modifications to above technical solutions as an equivalent embodiment without departing from scope of the technical solutions of the disclosure. Any simple amendments, equivalent changes and modifications made to the embodiments based on technical substance of the disclosure, without departing from content of the technical solutions of the disclosure, still fall within the scope of the technical solutions of the disclosure.

What is claimed is:

1. A polycrystalline diamond compact (PDC) bit with cutters, comprising: a bit body (3) and a bit connecting component (4), wherein the bit body (3) is provided with blades (8), and nozzles (2) are defined on the bit body (3) and are disposed between the blades (8); and the blades (8) are provided with integral cutters (1) respectively, each of the integral cutters (1) covers a cutter installation working surface (10) of a corresponding one of the blades (8), a shape of each of the integral cutters (1) matches with a crown shape of the corresponding one of the blades (8), and each of the integral cutters (1) is installed on and fitted along the crown shape of the corresponding one of the blades (8);

wherein each of the blades (8) comprises two side surfaces opposite to each other and an outer surface disposed between and connected to the two side surfaces, one of the two side surfaces defines a mounting slot, and each of the integral cutters (1) is installed in the mounting slot of the corresponding one of the blades (8); and wherein the one of the two side surfaces is further provided with multiple conventional gauge cutters (5) thereon, and the multiple conventional gauge cutters (5) are separated from the integral cutters (1) installed in the mounting slot on the one of the two side surfaces.

2. The PDC bit with cutters as claimed in claim 1, wherein a back rake angle of each of the integral cutters (1) is in a range of 5-30°, the back rake angle is an angle between a working surface (11) of each of the integral cutters (1) and an outer normal line of a bit surface passing through a cutter positioning point, and back rake angles of the integral cutters (1) on the blades (8) are same or different to meet requirements for force balance.

3. The PDC bit with cutters as claimed in claim 1, wherein a diameter of each of the multiple conventional gauge cutters (5) is 13 millimeters (mm), a number of the multiple conventional gauge cutters (5) is in a range of 3-6, and a back rake angle of each of the multiple conventional gauge cutters (5) is in a range of 15-20°.

4. The PDC bit with cutters as claimed in claim 1, wherein the integral cutters (1) have a plurality of types, different types of the integral cutters (1) have different dimensions and/or different working surface shapes, the dimensions comprise: a length, a width, a thickness, and a size of chamfers on adjacent surfaces, and structures of the working surface shapes at least comprise: a planar surface structure, a wavy surface structure, and a serrated surface structure.

5. The PDC bit with cutters as claimed in claim 1, wherein types of the integral cutters (1) on the blades (8) are different, and lengths of the integral cutters (1) on the blades (8) are different to make working surfaces (11) of the integral cutters (1) fully cover a wellbore bottom to thereby achieve cutting to the wellbore bottom, and to make at least one of the blades (8) fully cover the wellbore bottom.

6. The PDC bit with cutters as claimed in claim 5, wherein a number of the blades (8) on the bit body (3) is five, a number of main blades (81) of the blades (8) is at least two, each of the main blades (81) of the blades (8) is mounted with a corresponding one of the integral cutters (1), and cutting surfaces of the main blades (81) of the blades (8) together are configured to fully cover the wellbore bottom.

7. The PDC bit with cutters as claimed in claim 1, wherein for each of the blades (8), the multiple conventional gauge cutters (5) are only disposed on the second part of the one of the two side surfaces, but not disposed on the outer surface or the other of the two side surfaces.

8. The PDC bit with cutters as claimed in claim 1, wherein a height (101) from a surface of each of the integral cutters (1) facing away from the bit body (3) to the outer surface of the corresponding one of the blades (8) is in a range of 2-3 mm.

9. The PDC bit with cutters as claimed in claim 1, wherein the one of the two side surfaces comprises a first part and a second part, the first part is closer to the nozzles (2) than the second part, the first part defines the mounting slot, the second part is a gauge surface (9), and the multiple conventional gauge cutters (5) are disposed on the gauge surface (9).

10. A PDC bit with cutters, comprising: a bit body (3) and a bit connecting component (4), wherein the bit body (3) is provided with blades (8), and nozzles (2) are defined on the bit body (3) and are disposed between the blades (8); and the blades (8) are provided with integral cutters (1) respectively, each of the integral cutters (1) covers a cutter installation working surface (10) of a corresponding one of the blades (8), a shape of each of the integral cutters (1) matches with a crown shape of the corresponding one of the blades (8), and each of the integral cutters (1) is installed on and fitted along the crown shape of the corresponding one of the blades (8);

wherein each of the blades (8) comprises two side surfaces opposite to each other and an outer surface disposed between and connected to the two side surfaces, one of the two side surfaces comprises a first part and a second part, the first part is closer to the nozzles than the second part, the first part defines a mounting slot, and each of the integral cutters (1) is installed in the mounting slot of the corresponding one of the blades (8); and wherein the second part of the one of the two side surfaces is a gauge surface (9), the gauge surface (9) defines one strip-shaped hole, and a strip-shaped gauge cutter (6) is installed in the strip-shaped hole.

11. The PDC bit with cutters as claimed in claim 10, wherein a thickness of the strip-shaped gauge cutter (6) is 6 mm, and a back rake angle of the strip-shaped gauge cutter (6) is in a range of 15°-20°.

12. The PDC bit with cutters as claimed in claim 10, wherein an inclination angle of the strip-shaped hole is in a range of 15°-20°.

\* \* \* \* \*